United States Patent [19]

Lee

[11] Patent Number: 5,928,425

[45] Date of Patent: Jul. 27, 1999

[54] CHEMICAL CATCHER

[75] Inventor: Do-Gyung Lee, Seoul, Rep. of Korea

[73] Assignee: Samsung Electronics Co., Ltd., Suwon, Rep. of Korea

[21] Appl. No.: 08/873,294

[22] Filed: Jun. 11, 1997

[30] Foreign Application Priority Data

Jul. 1, 1996 [KR] Rep. of Korea .................. 96-26630

[51] Int. Cl.⁶ .................................................. B05C 11/02
[52] U.S. Cl. .............................. 118/712; 118/52; 118/319
[58] Field of Search ........................... 118/52, 319, 320, 118/300, 501, 712; 222/108; 141/87; 239/104, 120, 121; 134/902

[56] References Cited

U.S. PATENT DOCUMENTS 5,261,566  11/1993  Nakayama ................................. 118/52

Primary Examiner—Laura Edwards
Assistant Examiner—Calvin Padgett
Attorney, Agent, or Firm—Jones & Volentine, L.L.P.

[57] ABSTRACT

This chemical catcher is provided to collect chemical materials in the manufacturing process of the semiconductor device. In particular, this collects the remaining chemical materials for preventing the undesirable effects incurred by the remaining chemical materials after the chemical materials are practically used in the manufacturing process of the semiconductor device. This chemical catcher is mounted to a chemical injecting apparatus which injects the chemical in the manufacturing process of semiconductor, which is comprised of a chemical collecting means arranged in relation to an injection nozzle of the chemical injecting apparatus in order to collect the falling chemical from the injection nozzle, by which means the remaining chemical in the injection nozzle after the chemical injection process is effectively collected and therefore the production of semiconductor having poor quality is reduced.

10 Claims, 2 Drawing Sheets

CHEMICAL CATCHER

BACKGROUND OF THE INVENTION

The present invention relates to a chemical catcher for collecting chemical materials during a manufacturing process of a semiconductor device. In particular, this apparatus collects the chemical materials remaining after the chemical materials are used in the manufacturing process of a semiconductor device. This prevents undesirable effects that may be caused by the remaining chemical materials.

Semiconductor devices are manufactured using various fabrication processes, such as single crystal producing processes, wafer treatment processes, and the like. In such processes, various chemical materials are used, e.g., in film diffusing, for depositing, for etching, etc. Such materials are generally applied using a chemical injection process. Accordingly, to perform the chemical injecting processes, a chemical injecting apparatus is required.

FIG. 1 is a schematic drawing of a conventional chemical injecting apparatus. As shown in Fig. 1, the chemical injecting apparatus for injecting a chemical onto a wafer 1 comprises an injection nozzle 3, an induction pipe 5 and an absorption, or suck-back, system 7. The injection nozzle 3 injects a predetermined chemical material onto the semiconductor wafer 1. The induction pipe 5 carries the predetermined chemical to the injection nozzle 3. The absorption, or suck-back, system 7 absorbs the remaining chemical from the injection nozzle 3 after the chemical injection process and processes the absorbed chemical material. Any remaining chemical that is not absorbed or sucked back by the absorption system 7 might detrimentally effect the semiconductor elements on the wafer 1.

In this apparatus, the absorption system 7 acts to absorb any excess amount of the predetermined chemical used in processing. This absorption is generally accomplished by using air pressure. Unfortunately the absorption process is not perfect, and some of the chemical often remains in the injection nozzle 3. Although the remaining chemical is identical to the chemical used in the manufacturing process, it may have a detrimental effect on the semiconductor elements being processed if it is allowed to drip on the wafer even after normal processing has been completed. If such dripping is allowed, wafers of poor quality may be produced and the yield of the semiconductor elements may be reduced.

Specifically, two main problems may occur. The absorption pressure of the absorption system 7 may be too low to prevent the chemical from dripping, or the chemical itself may have viscosity too low to properly allow the absorption system to function. In either case, these deficiencies may cause the chemical to remain in the injection nozzle 3 after wafer processing and to fall on the wafer 1. As noted above, this can degrade the quality of the wafer 1, and can lead to production losses and a reduction in productivity.

SUMMARY OF THE INVENTION

In view of the above, an abject of the present invention is to provide a chemical catcher that solves the problems mentioned above and reduces the damage to semiconductor elements incurred by unnecessary exposure to chemical material.

In order to achieve the above-mentioned object, there is provided a chemical injecting apparatus, comprising: an injection nozzle for injecting a chemical onto a wafer in a semiconductor manufacturing process, and a chemical collecting apparatus placed between the wafer and the injection nozzle, for selectively preventing the chemical from falling from the injection nozzle onto the wafer.

In addition, the chemical injecting apparatus further comprises an induction pipe for carrying the chemical to the injection nozzle, and a chemical absorption system, mounted on the induction pipe, for selectively absorbing the chemical from the injection nozzle. The chemical absorption system preferably absorbs the chemical using air pressure. The chemical absorption system absorbs the chemical after at least part of the semiconductor manufacturing process is completed.

The chemical collecting apparatus comprises a chemical catcher for collecting the chemical falling from the injection nozzle when in an intercepting position, and a driving device for selectively shifting the chemical catcher from the intercepting position to a non-intercepting position, and vice versa. The driving device shifts the chemical catcher into the non-intercepting position during the semiconductor manufacturing process, and shifts the chemical catcher into the intercepting position when at least part of the semiconductor manufacturing process is completed. The driving device is preferably a driving motor.

The chemical collecting apparatus further comprises a controller for controlling the rotation of the driving device to control the shifting of the chemical catcher from the intercepting position to the non-intercepting position, and vice versa.

The chemical catcher preferably comprises a material that enables the chemical collected in the chemical catcher to be ascertained with the naked eye.

DETAILED DESCRIPTION OF THE PREFERRED EMBODIMENT OF THE PRESENT INVENTION

Figure 1:
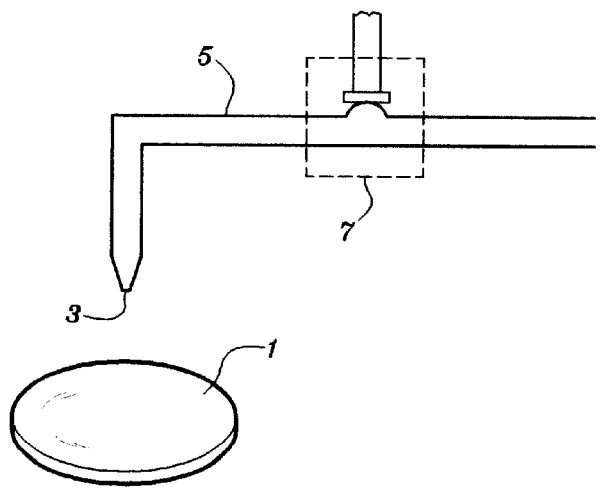
FIG. 1 is a schematic view of a conventional chemical injecting apparatus employed in a semiconductor manufacturing system.

A chemical injecting apparatus having a chemical catcher according to a preferred embodiment of the present invention is described below with reference to the accompanying drawings.

The chemical injecting apparatus comprises an injection nozzle 3, an induction pipe 5, an absorption, or suck-back, system 7, and a collecting means 100. The injection nozzle 3 injects a predetermined chemical material onto the semiconductor wafer 1. The induction pipe 5 carries the predetermined chemical to the injection nozzle 3. The absorption system 7 is mounted on the induction pipe 5 to absorb the chemical using air pressure. The chemical collecting means 100 is arranged in relation to the chemical injection nozzle 3 and collects the falling chemical from the injection nozzle 3 of the chemical injecting apparatus.

The chemical collecting means itself 100 comprises a chemical catcher 10, a driving motor 20, electric lines 22, a motor fixing device 24, a duct 26, and a controller 30. The controller 30 and the driving motor 20 are connected through electric lines 22, which comprise signal lines and power lines. The duct 26 protects the driving motor 20 and the electric lines 22. The motor fixing means 24 is placed between the duct 26 and the driving motor 20, to hold the driving motor 20 in place.

Depending upon its position, the chemical catcher 10 can operate to receive any chemical falling from the injection nozzle 3. Preferably, the chemical catcher 10 is made of a material that enables the collected chemical in the chemical catcher 10 to be observed with the naked eye and allows the operation state of the absorption system 7 to be determined.

The driving motor 20 is connected to the chemical catcher 10 and shifts the chemical catcher 10 from one position to another. The controller 30 controls the chemical injecting apparatus, i.e., the induction pipe 5 and the injection nozzle 3, and the absorption system 7 in relation to each other.

The controller 30 and the driving motor 20 are connected through the electric lines 22, which comprise signal lines and power lines. The duct 26 surrounds and protects the driving motor 20 and the electric lines 22. The motor fixing device 24 is positioned between the duct 26 and the driving motor 20, and operates to substantially fix the driving motor 20.

Figure 2:
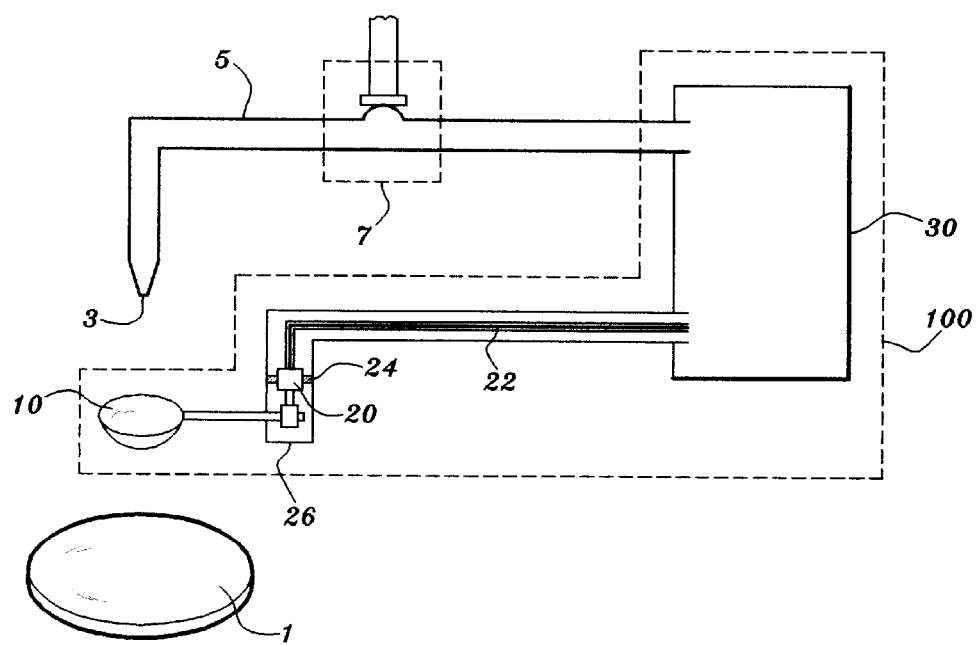
FIG. 2 is a schematic view of a chemical catcher according to a preferred embodiment of the current invention.

The function and the operation of the chemical catcher of the preferred embodiment of this invention are described below with reference to FIGS. 2 and 3.

In operation, the chemical catcher 10 is generally placed in one of two positions. In the position designated "A," shown using a solid line in FIG. 3, the chemical catcher 10 is directly between the injection nozzle 3 and the wafer 1. This is preferably the position the chemical catcher 10 remains in after the processing of the wafer 1. Any chemical that remains in the injection nozzle 3 after the chemical injection process and drips down towards the wafer 1 will be collected as it falls by the chemical catcher 10.

Figure 3:
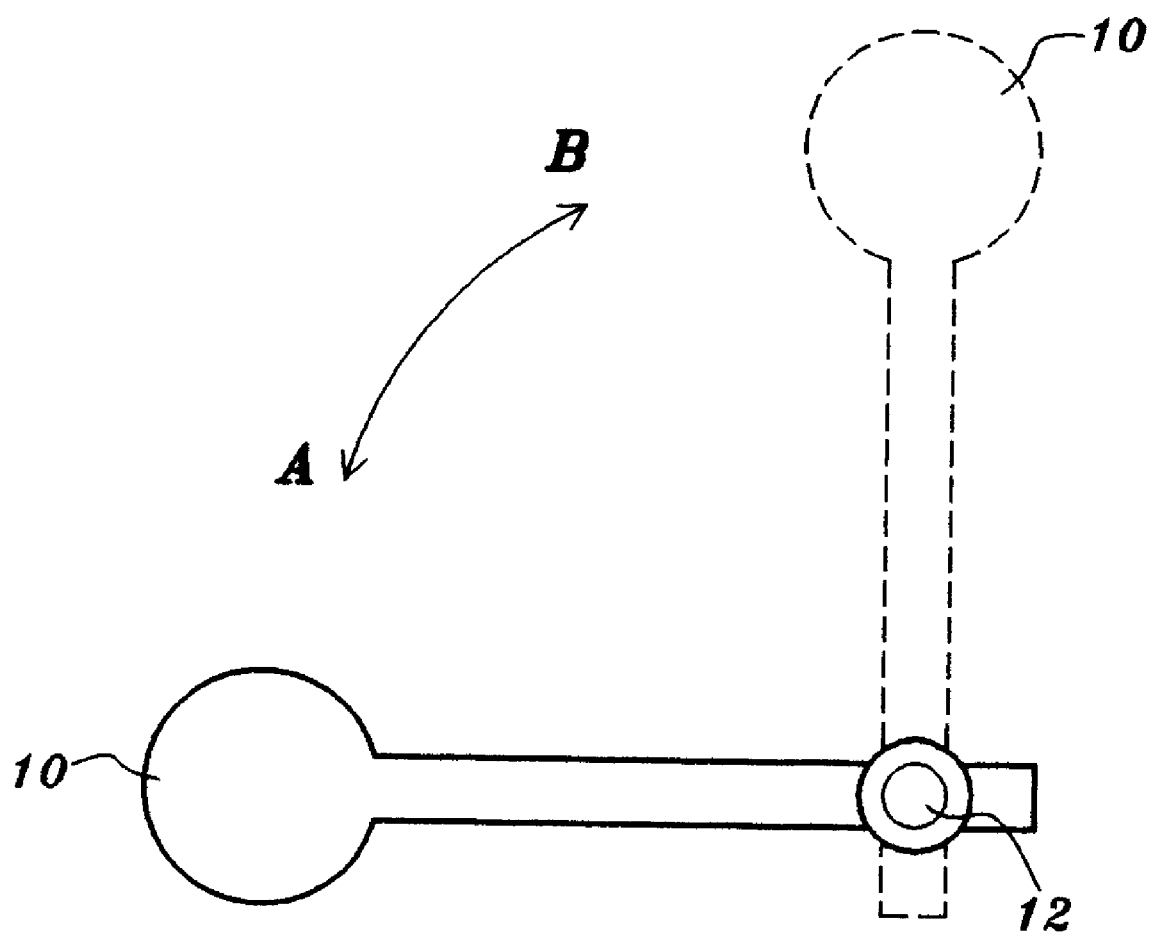
FIG. 3 is an overhead view that shows a position of a chemical catcher of the chemical catcher according to a preferred embodiment of the current invention.

In the position designated "B," shown using a dashed line in FIG. 3, the chemical catcher 10 is in a position where it will not interfere with the chemical passing from the injection nozzle 3 to the wafer 1. This is preferably the position the chemical catcher remains in during the processing of the wafer 1. The displacement of the chemical catcher 10 is preferably accomplished by rotating the chemical catcher 10 parallel to the wafer 1 on a rotation shaft 12 coaxial with the axis of rotation of the driving motor.

The chemical injection process begins with the chemical catcher 10 in position "B," where the chemical catcher 10 will not interfere with normal processing of the wafer 1. The chemical catcher is preferably moved into position "B" by using the driving motor 20 to rotate the shaft 12, based on a signal from the controller 30. Accordingly, in this initial position, if a chemical is injected through the injection nozzle 3, it can safely pass from the nozzle 3 to the wafer 1 for processing.

After processing is completed, the controller 30 directs the driving motor 20 to rotate the chemical catcher 10 into position "A." In this position, the chemical catcher 10 is situated directly between the injection nozzle 3 and the wafer 1. From this position, the chemical catcher 10 will catch any chemical dripping from the injection nozzle 3 before the chemical can reach the wafer 1. This can significantly reduce or eliminate the production of semiconductor elements having poor quality that would otherwise be caused by the dripping of the unabsorbed chemical from the injection nozzle 3.

The chemical catcher 10 is preferably made of a transparent material that enables an operator to determine the presence of any collected chemical in the chemical catcher 10 with the naked eye. This enables the operator to quickly determine the operation state of the absorption system 7, i.e., whether the absorption system 7 is properly functioning. As a result the chemical catcher 10 can function as a sensor that allows the operator to quickly detect the operation state of the absorption system 7.

When the absorption system 7 functions properly, no chemical remains in the injection nozzle 3, and so none can drip into the chemical catcher 10. When the absorption system functions improperly, some chemical remains in the injection nozzle 3 and then falls into the chemical catcher 10. By making the chemical catcher 10 out of a transparent material, it becomes easy to determine whether the absorption system is functioning properly.

As described above, this chemical catcher has the advantages in that any chemical remaining in the injection nozzle after the chemical injection process is effectively collected in the chemical catcher. This has the desirable effect of reducing the production of semiconductors having poor quality. This chemical catcher also has the advantage that it can function as a sensor for examining the state of operation of the chemical absorption system if it is made of the proper material.

The present invention is not limited to the above-described embodiments. Various changes and modifications may be effected by one having an ordinary skill in the art and remain within the scope of the invention, as defined by the appended claims.

What is claimed is:

1. A chemical injecting apparatus, comprising:
   an injection nozzle from which a chemical is injected onto a wafer in a semiconductor manufacturing process;
   an induction pipe connected to said injection nozzle and through which the chemical is fed to said nozzle;
   absorption means, mounted on said induction pipe, for removing chemical remaining in said nozzle after the injecting of the chemical onto the wafer is completed in the semiconductor manufacturing process; and
   a transparent chemical catcher movable between a non-intercepting position at which the catcher is at a location for allowing the chemical to be injected from the nozzle onto the wafer during the semiconductor manufacturing process, and an intercepting position at which the catcher is interposed between the wafer and the injection nozzle for catching any chemical falling from the injection nozzle despite the operation of said absorption means and for allowing the chemical caught to be seen thereon with the naked eye, thereby allowing the effectiveness of said absorption means to be ascertained.

2. A chemical injecting apparatus as claimed in claim 1, wherein said absorption means is for removing the chemical remaining in the nozzle using air pressure.

3. A chemical injecting apparatus as claimed in claim 1, and further comprising a controller connected to said absorption means and operative to control said absorption means to remove from said injection nozzle the chemical after at least part of the semiconductor manufacturing process is completed.

4. A chemical injecting apparatus as claimed in claim 1, and further comprising driving means for moving said chemical catcher between said intercepting position and said non-intercepting position.

5. A chemical injecting apparatus as claimed in claim 4, and further comprising a controller connected to said driving means and operative to control said driving means to move the chemical catcher to said non-intercepting position during the semiconductor manufacturing process.

6. A chemical injecting apparatus as claimed in claim 4, and further comprising a controller connected to said driving means and operative to control said driving means to move the chemical catcher to said intercepting position when at least part of the semiconductor manufacturing process is completed.

7. A chemical injecting apparatus as claimed in claim 4, and further comprising a controller connected to said driving means and operative to control said driving means to move said chemical catcher between said intercepting position and said non-intercepting position.

8. A chemical injecting apparatus as claimed in claim 4, wherein said driving means is a motor.

9. A chemical injecting apparatus as claimed in claim 8, and further comprising a rotary shaft connecting said motor to said chemical catcher, said shaft having a vertical axis about which said chemical catcher is rotatable between said intercepting position and said non-intercepting position.

10. A chemical injecting apparatus as claimed in claim 4, and further comprising a controller connected to said driving means and to said absorption means, said controller being operative to actuate and de-actuate said absorption means and to control said driving means to move said chemical catcher to said intercepting position in dependence with the actuation/de-actuation of said absorption means.

* * * * *